United States Patent [19]

Miyauchi

[11] Patent Number: 5,619,452
[45] Date of Patent: Apr. 8, 1997

[54] SEMICONDUCTOR DISK DEVICE WITH A CONSTANT DATA-WRITING TIME PERIOD

[75] Inventor: Shigenori Miyauchi, Itami, Japan

[73] Assignee: Mitsubishi Denki Kabushiki Kaisha, Tokyo, Japan

[21] Appl. No.: 429,773

[22] Filed: Apr. 27, 1995

[30] Foreign Application Priority Data

Oct. 17, 1994 [JP] Japan .................................. 6-250786

[51] Int. Cl.$^6$ .................................................. G11C 11/34
[52] U.S. Cl. .................. 365/185.29; 365/185.33; 365/185.2; 365/185.11; 395/430
[58] Field of Search .................... 365/185.29, 185.33, 365/185.2, 185.11; 395/430, 750

[56] References Cited

U.S. PATENT DOCUMENTS 5,406,529  4/1995  Asano .................... 365/218 X
5,418,752  5/1995  Harari et al. .................... 365/218

Primary Examiner—David C. Nelms
Assistant Examiner—Huan Hoang
Attorney, Agent, or Firm—Leydig, Voit & Mayer

[57] ABSTRACT

A semiconductor disk device provided with a flash memory capable of performing a stable block erasing operation in a short time period wherein the variations in the erasing times from block to block are minimized. The semiconductor disk device includes: a flash memory having a data storage area and an erasing-condition storage area in which an erasing condition has been written in advance. A CPU is provided and functions as a memory controller. A voltage controlling circuit is provided for changing applied voltages VCC and VPP under the control of the CPU. The CPU has the power supply voltage calculating capability of comparing the erasing condition stored in the erasing-condition storage area of the flash memory with a predetermined reference condition, and determining an optimal power supply voltage for each block so that the actual erasing time for each block becomes equal to a minimized constant value.

10 Claims, 10 Drawing Sheets

5,619,452

SEMICONDUCTOR DISK DEVICE WITH A CONSTANT DATA-WRITING TIME PERIOD

BACKGROUND OF THE INVENTION

1. Field of the Invention

The present invention relates to a semiconductor disk device having a semiconductor memory element such as a flash memory serving as a storage medium.

2. Description of the Related Art

Currently, magnetic disk storage devices such as hard disk drives and floppy disk drives are widely used as external storage devices for a computer systems. However, these magnetic disk storage devices have the disadvantage that they consume large amounts of electricity. As an alternative external storage device to the magnetic disk storage devices having such a disadvantage, semiconductor disk devices having a semiconductor memory element such as a flash memory element are receiving much attention.

FIG. 10 illustrates a configuration of a conventional semiconductor disk device of this type. In FIG. 10, the semiconductor disk device inputs and outputs data from or to an external host system via an interface circuit 3. A CPU 4 receives the data that is input via the interface circuit 3 and writes the data into a flash memory 5. The CPU 4 also reads data from the flash memory 5 and outputs the data to the host system via the interface circuit 3. The flash memory 5 stores the above received data. As described above, the conventional semiconductor disk device comprises the interface circuit 3, CPU 4, and flash memory 5.

The flash memory 5 is a non-volatile memory capable of electrically writing and erasing data. In an erasing operation, an entire data block consisting of several tens of Kbytes to several ten Kbytes is erased at one time. The CPU 4 also acts as a memory controller for controlling the flash memory 5.

As shown in FIG. 10, the semiconductor disk device 1 is connected to an external host system 11 such as a computer.

The semiconductor disk device 1 shown in FIG. 10 operates in a similar manner to that of conventional hard disk storage devices. That is, the semiconductor disk device 1 receives data from the host computer 11 and stores the received data in the flash memory 5, and reads data from the flash memory 5 according to instructions issued by the host computer 11. Unlike the conventional hard disk storage devices, however, the semiconductor disk device 1 cannot overwrite data. Therefore, it is necessary to erase the entire area of a particular block before writing data in it.

Conventional semiconductor disk devices are constructed with a flash memory in a fashion such as that shown in FIG. 10, and therefore, as described above, it is necessary to perform block-erasing before writing data. However, the data erasing time of a flash memory varies from block to block, and therefore the data writing time also varies from block to block. As a result, the characteristics and life of the flash memory vary from block to block, which sometimes causes instability in operation, and which further causes degradation of the overall performance of the semiconductor disk device.

SUMMARY OF THE INVENTION

It is an object of the present invention to solve the above problems. More specifically, it is an object of the present invention to provide a semiconductor disk device capable of writing data in a short and substantially constant time span.

To achieve the above object, the present invention provides a semiconductor disk device, comprising: a memory including a plurality of blocks, each block including a data storage area and an erasing-condition storage area in which an erasing condition has been written in advance; a data controller that writes data provided from the outside into the data storage area of the memory, and also reads data from the data storage area of the memory and outputs it to the outside; a power supply voltage calculating unit that compares the erasing condition stored in the erasing-condition storage area of the memory with a predefined reference condition, thereby determining a power supply voltage that minimizes the difference between the reference condition and the actual erasing condition for each block of the memory; a memory power supply unit that, in response to the output of the power supply voltage calculating unit, supplies electric power to the memory during an erasing process; and an erasing-control unit that erases data from block to block of the memory.

DESCRIPTION OF THE PREFERRED EMBODIMENTS

Embodiment 1

Figure 1:
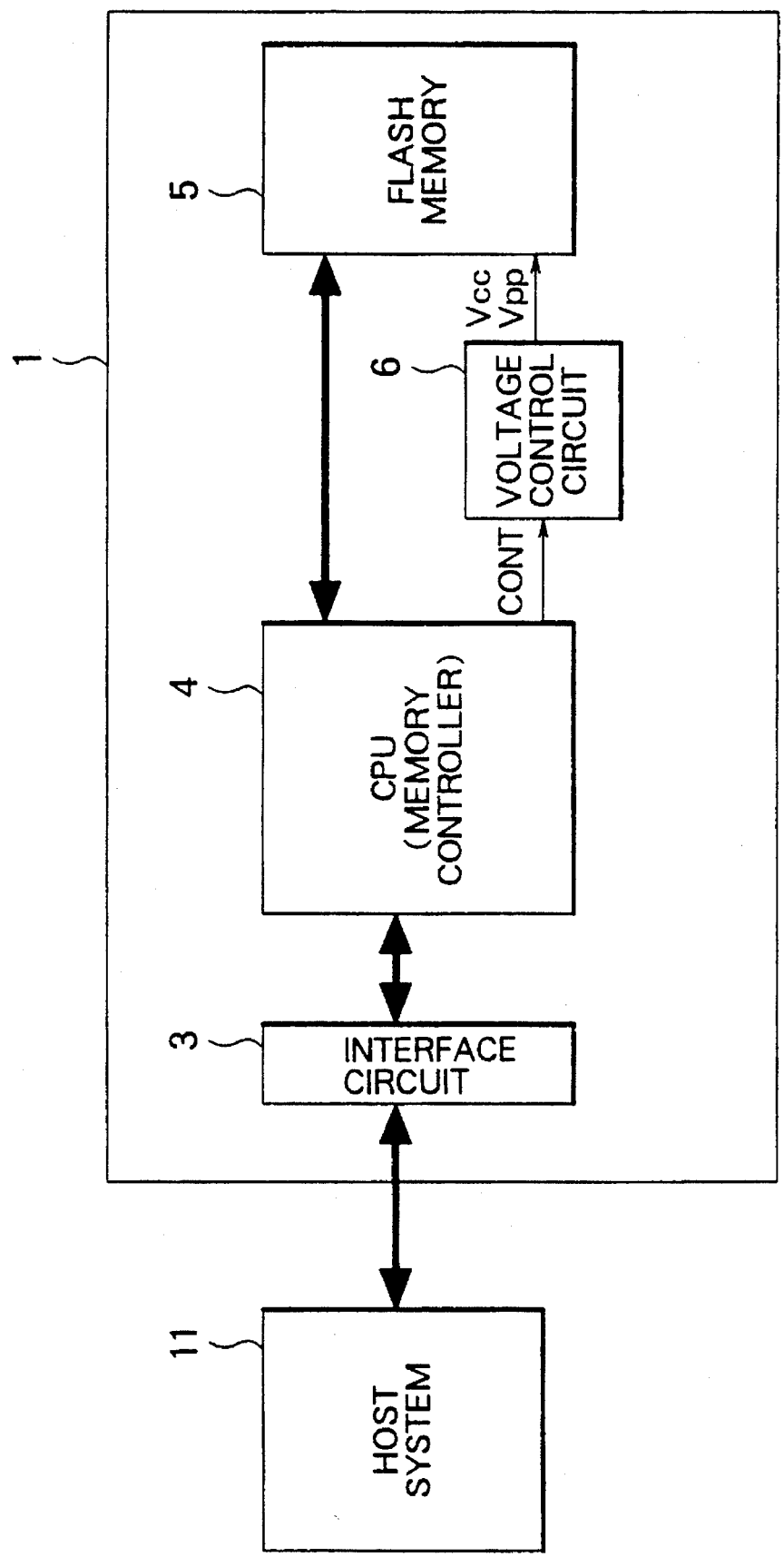
FIG. 1 is a schematic diagram illustrating the configuration of a first embodiment of a semiconductor disk device according to the present invention.

A first embodiment of the present invention will now be described below. FIG. 1 illustrates the configuration of a semiconductor disk device according to the first embodiment. In FIG. 1, the semiconductor disk device inputs and outputs data from or to an external host system 11 via an interface circuit 3. A CPU 4 receives the data that is input via the interface circuit 3, and writes the received data into a flash memory 5, and also reads data from the flash memory 5 and outputs the data to the host system 11 via the interface circuit 3. The flash memory 5 stores the received data. In response to a control signal (CONT) provided by the CPU 4, a voltage control circuit 6 generates supply voltages VCC and VPP having proper voltages and provides them to the flash memory 5.

The flash memory 5 is a non-volatile memory capable of electrically writing and erasing data. In an erasing operation, a entire data block consisting of several Kbytes to several tens of Kbytes is erased at one time. The CPU 4 also acts as a memory controller for controlling the flash memory 5. Thus, the CPU 4 performs: data control in writing and reading data; erasing control in erasing data from block to block; and calculation of the supply voltage which generates the control signal (CONT) to the voltage control circuit 6.

The above-described elements including the interface circuit 3, CPU 4, flash memory 5, and voltage control circuit 6 form the semiconductor disk device 1.

As shown in FIG. 1, the semiconductor disk device 1 is connected to the external host system 11 such as a computer.

The semiconductor disk device 1 shown in FIG. 1 operates in a similar manner to that of conventional hard disk storage devices. That is, the semiconductor disk device 1 receives data from the host computer 11, and stores the received data in the flash memory 5. The semiconductor disk device 1 also reads data from the flash memory 5 according to instructions issued by the host computer 11.

Figure 2:
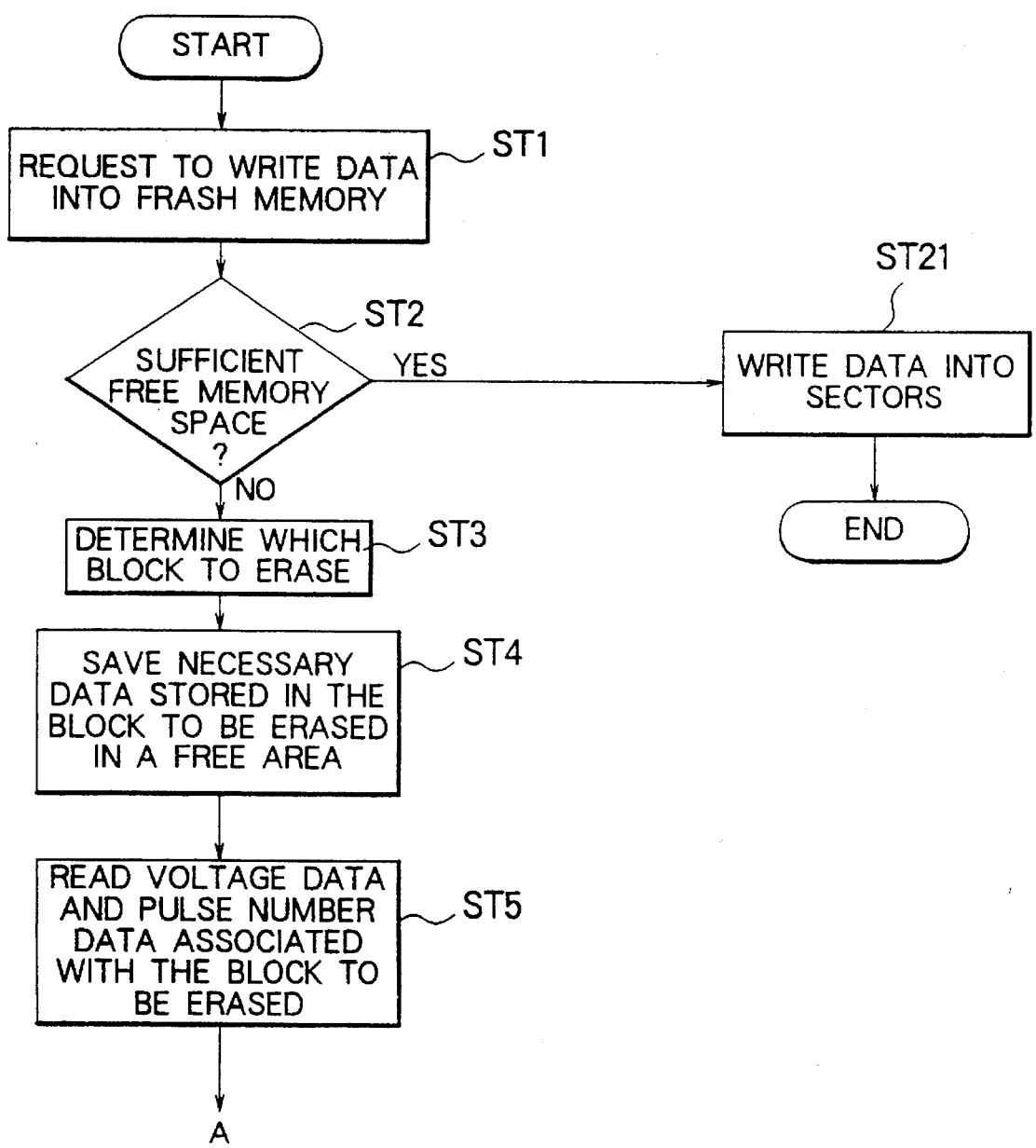
FIG. 2 is a flow chart illustrating a block-erasing process of the semiconductor disk device according to the first embodiment of the present invention.
Figure 3:
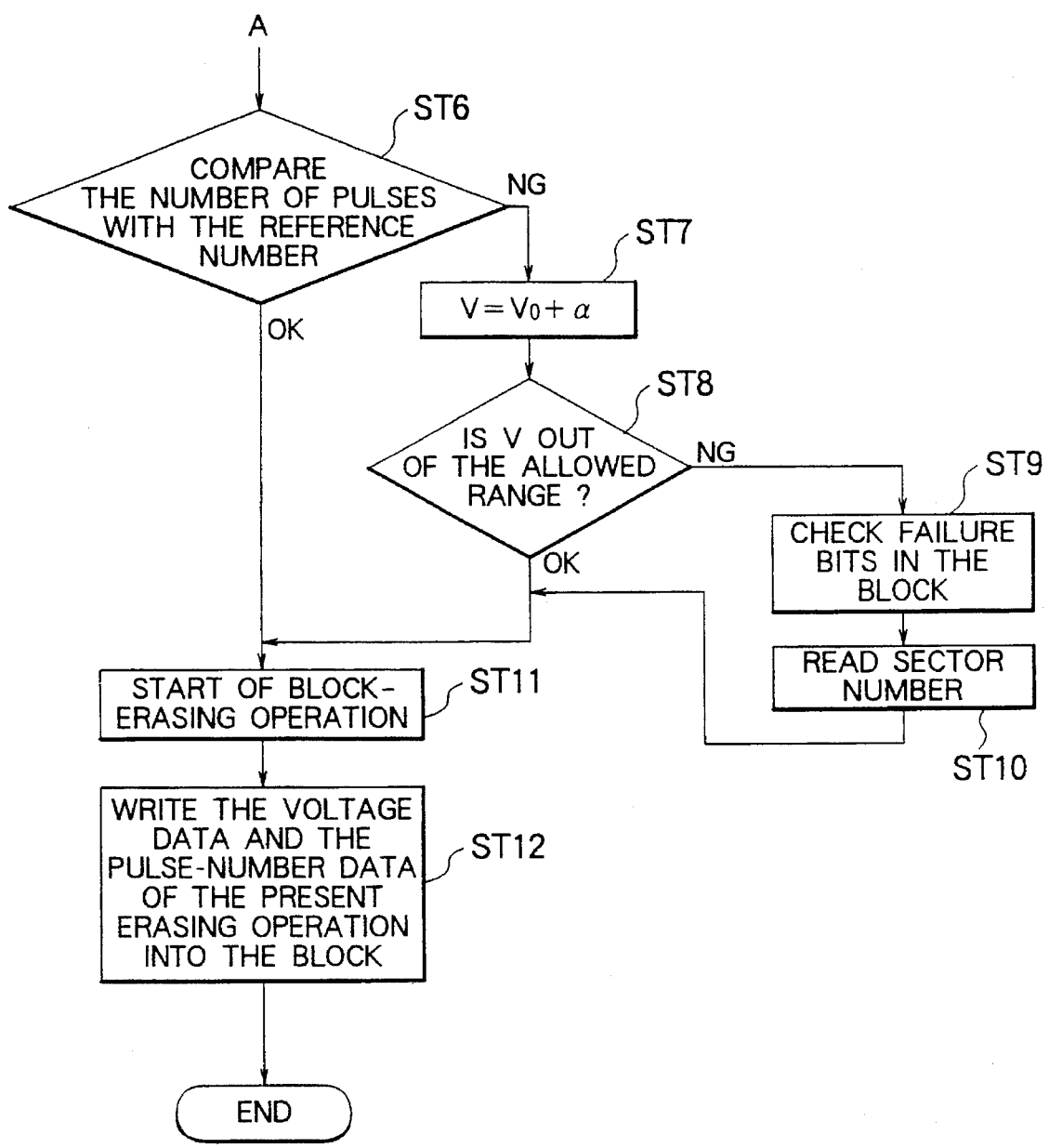
FIG. 3 is a flow chart continued from FIG. 2, illustrating the block-erasing process of the semiconductor disk device according to the first embodiment of the present invention.

FIGS. 2 and 3 are a flow chart illustrating a block-erasing process in a writing operation of the flash memory 5. For convenience of representation, the complete flow chart is divided into two portions shown in FIGS. 2 and 3, respectively, wherein the output A of step ST5 in FIG. 2 is connected to the input A of step ST6 in FIG. 3.

Figure 4:
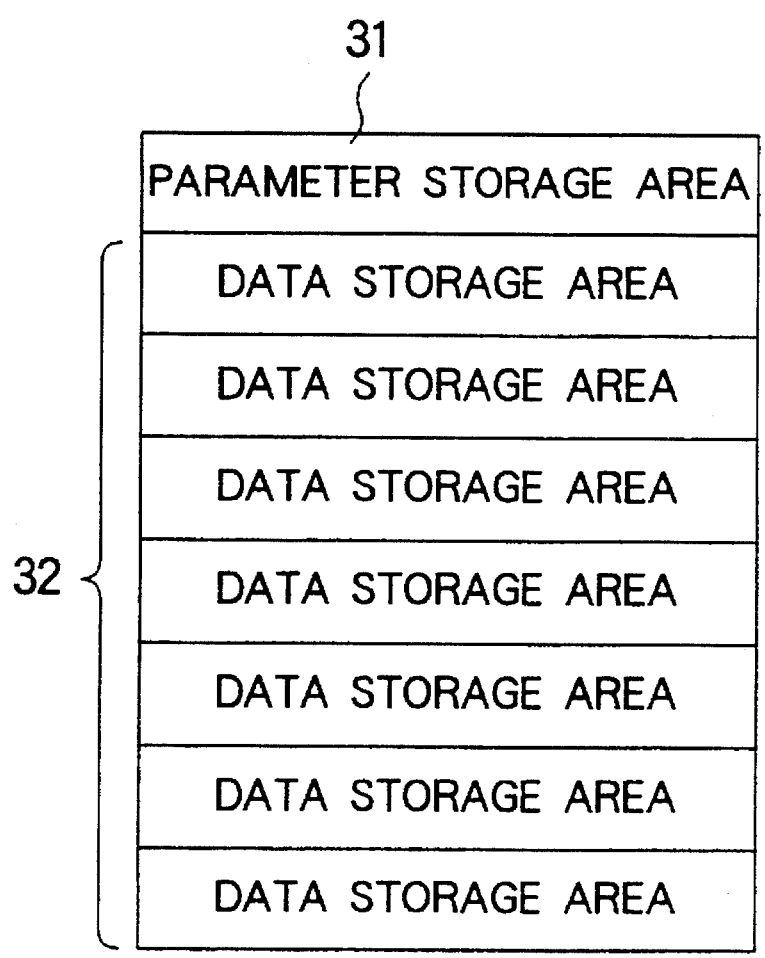
FIG. 4 is a schematic representation of an example of the memory space of one block of a flash memory used in the semiconductor disk device according to the first embodiment of the present invention.

FIG. 4 illustrates the construction of one block of the flash memory 5 wherein the erasing of data is performed one block at a time. That is, the erasing process of the flash memory 5 is performed from block to block each having the same size as shown in FIG. 4. The memory space of the flash memory 5 includes a plurality of blocks, wherein FIG. 4 illustrates the internal organization of only one of the plurality of blocks.

In FIG. 4, a parameter storage area 31 stores the number of pulses required for the previous erasing process, and also stores the value of the supply voltage used in that erasing process. A plurality of data storage areas 32 each store data received from the host system 11. Each of these data storage areas 32 corresponds to a sector that is a single unit in a writing and reading operation. Each block has one parameter storage area 31. The parameter storage area 31 has been initialized in advance.

Figure 5:
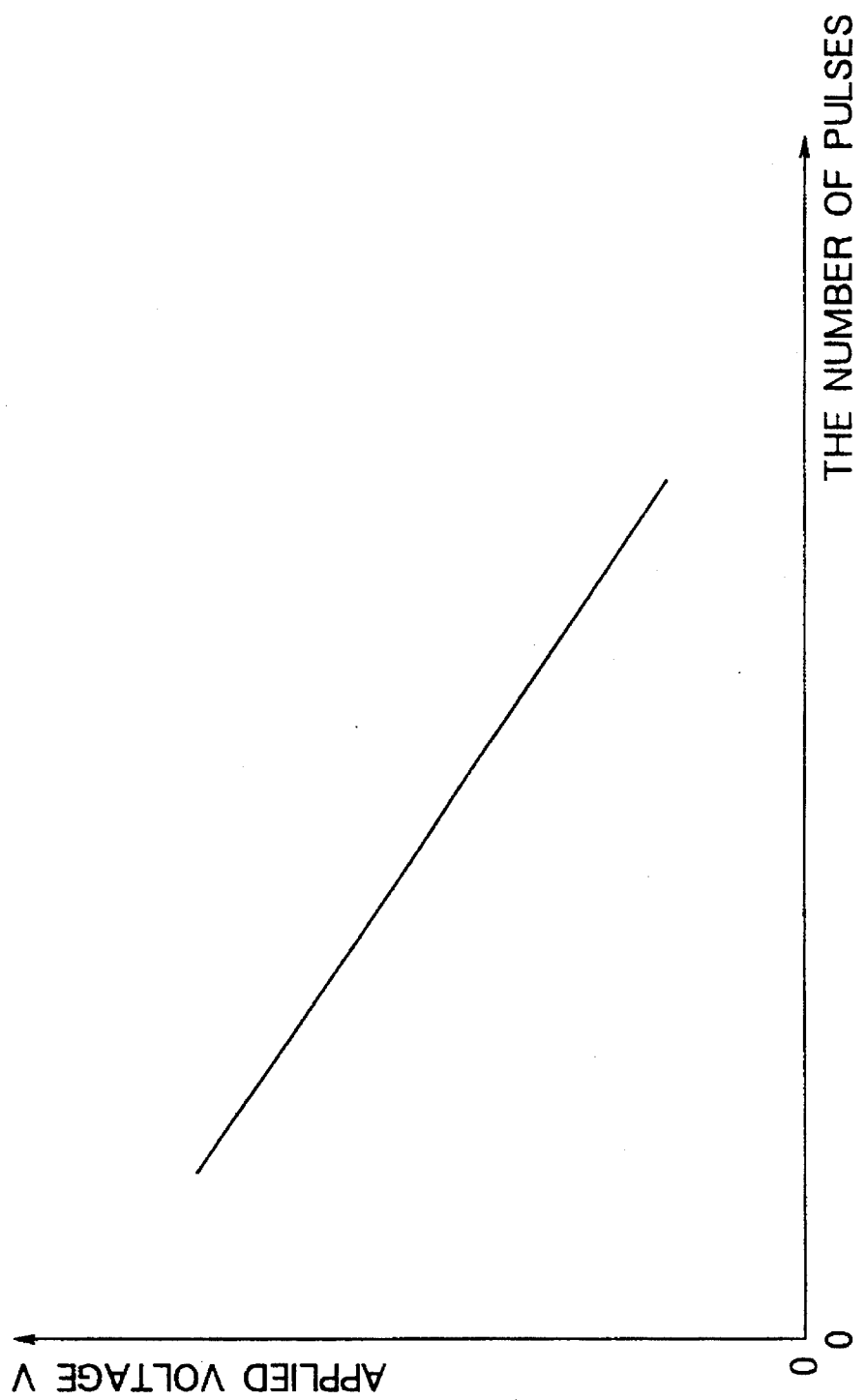
FIG. 5 relates to the first embodiment of the present invention, and illustrates the general relationship between the supply voltage applied to the flash memory and the number of erasing pulses required.

FIG. 5 is a graph illustrating the general relationship between the supply voltage applied to the flash memory and the number of erasing pulses required. The vertical axis of FIG. 5 represents the applied voltage, and the horizontal axis represents the number of pulses required for the erasing process. As can be seen from FIG. 5, the required number of erasing pulses decreases as the applied supply voltage increases.

Figure 6:
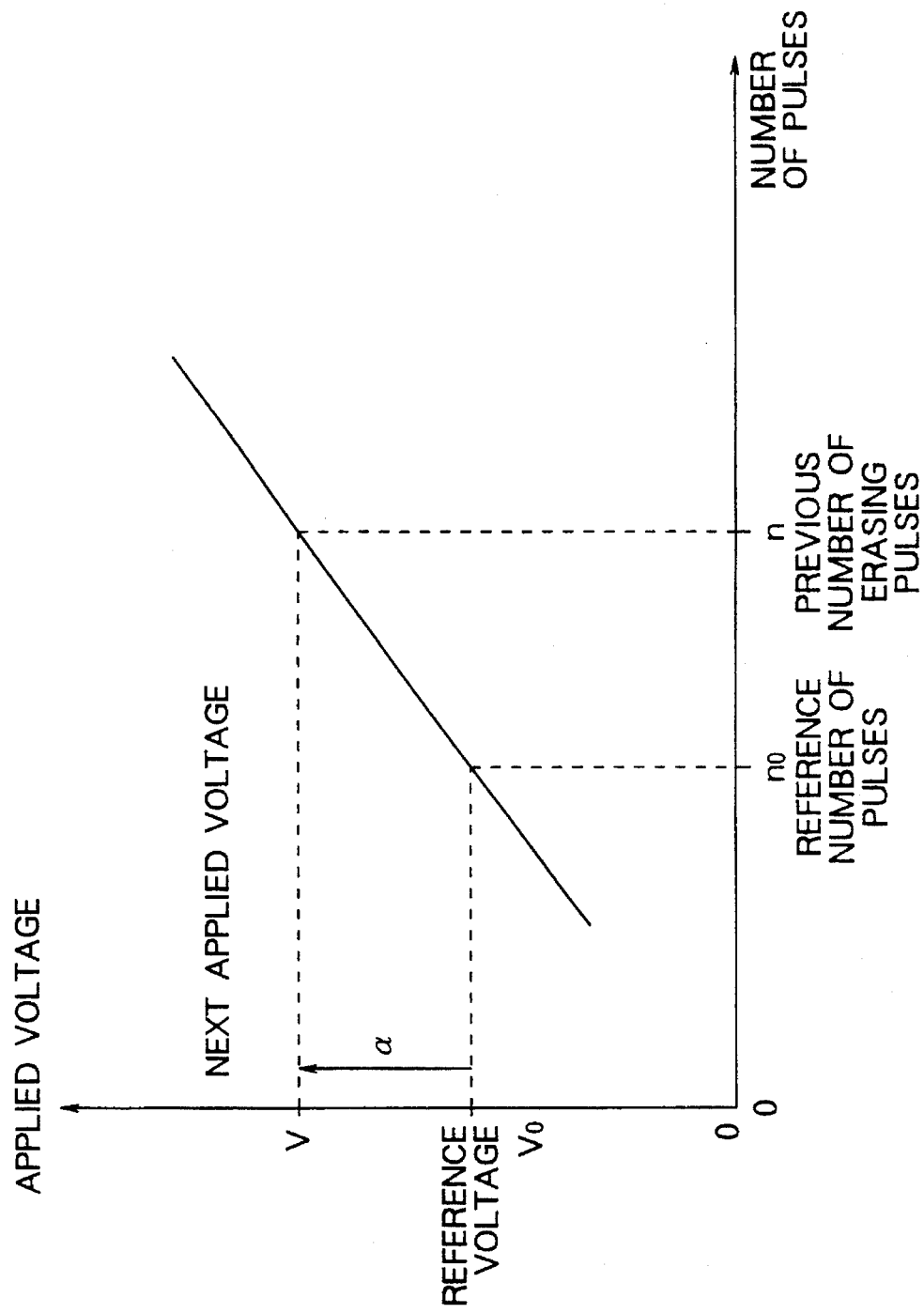
FIG. 6 illustrates a method of determining the supply voltage applied to the flash memory from the previous number of erasing pulses and a reference number, according to the first embodiment of the present invention.

FIG. 6 illustrates a manner of determining the applied voltage required to decrease the number of erasing pulses down to a value equal to a reference number. As shown in FIG. 6, the applied voltage for the next erasing operation is set to a value greater than the reference voltage by an amount $\alpha$ corresponding to the difference between the number of erasing pulses n in the previous erasing operation and the reference number of erasing pulses $n_0$.

The operation will now be described in more detail.

In the semiconductor disk device according to the first embodiment of the present invention, the erasing time is maintained as a constant for all erasing blocks in the manner described below.

The parameter storage area 31 stores the number of erasing pulses required for the erasing process in the previous writing operation. In the erasing operations, the CPU 4 checks whether the previous number of erasing pulses is greater than the predetermined reference number. The CPU 4 increases the supply voltages VCC and VPP applied to a particular block of the flash memory to be erased within a range below the maximum allowed limit, thereby reducing the number of erasing pulses to a proper value. Thus, the erasing operation is performed with the number of erasing pulses equal to or less than the reference number. As a result, variations in the erasing times among blocks to be erased is minimized.

The above process is based on the fact that the number of erasing pulses can be reduced by increasing the voltage VCC or VPP applied to the flash memory as seen from FIG. 5 which schematically represents the number of erasing pulses (horizontal axis) that decreases with increases in the applied voltage (vertical axis).

Referring to the flow chart shown in FIGS. 2 and 3, the operation of the semiconductor disk device according to the first embodiment will now be described in more detail.

STEP ST1: Reception of a "Request To Write Data into Flash Memory"

When the host system 11 issues a request to write data into the flash memory, the request is received by the CPU 4 via the interface circuit 3. Upon receipt of the request, the CPU 4 starts its required operation.

STEP ST2: Checking whether there is "Sufficient Free Memory Space"

The CPU4 determines whether the flash memory 5 has enough free memory space to write the data requested. If enough free memory space is available (yes), there is no need to erase any block to increase the free memory space, and thus the process proceeds to step ST21 in which the data is written somewhere in the free memory space to complete the writing process.

On the other hand, if it is concluded in step ST2 that the free memory space is less than the required amount (no), then the process proceeds to step ST3. This is the case, for example, when the free memory space is less than the required amount by one block.

STEP ST3: "Determine Which block to erase"

The CPU 4 determines the number of blocks to be erased depending on the required amount of memory space, and further determines specifically which blocks should be erased based on the number determined.

In this process, the blocks to be erased are specified according to the following criteria:

Select blocks which have been erased less times in the past than the others;

Select blocks which require less erasing pulses; and

Select blocks including a larger number of areas storing data already used.

Here, the "data already used" refers to, for example, a case in which a file is updated. The old data of said file that remains unchanged in a block is "data already used". As a result of the fact that it is impossible to overwrite in a flash memory, "data already used" is generated.

STEP ST4: "Save Necessary Data Stored in the Block to be Erased in a Free Area"

If some necessary data remains in the blocks to be erased, the CPU 4 saves the data in free memory areas, so as to prevent the data from being erased during a block-erasing operation.

STEP ST5: "Read Voltage Data and Pulse-Number Data Associated with the Block to be Erased"

The CPU 4 reads the data representing the number of pulses required for the previous writing operation, and also reads the data representing the voltages VCC and VPP. This data is stored in parameter storage areas 31 of the specified blocks to be erased.

STEP ST6: "Compare the Number of Pulses with the Reference Number"

The CPU 4 compares the above read-out data representing the number of pulses of the previous erasing operation with the predetermined reference number. If these numbers are equal to each other or if the difference is within a predetermined small range (OK), then the process proceeds to step ST11 in which the block is erased.

If the difference is out of the above range (NG), then the process proceeds to step ST7.

STEP ST7: "$V=V_0+\alpha$"

The CPU 4 adds a certain value a to the predetermined reference voltage $V_0$, so as to reduce the required number of erasing pulse by increasing the voltages VCC and VPP. The particular value of $\alpha$ is determined according to the relationship shown in the graph of FIG. 6.

The graph of FIG. 6 illustrates the relationship between the number of pulses of the previous erasing operation and the voltage that should be applied depending on this number. The graph of FIG. 6 is produced from the graph shown in FIG. 5 such that FIG. 6 indicates the applied voltage that allows the number of erasing pulses to be equal to the reference number. In FIG. 6, the reference number of pulses $n_0$ corresponds to the reference voltage $V_0$, and the number of pulses n of the previous erasing operation corresponds to the applied voltage V, wherein $V-V_0=\alpha$. The CPU 4 maintains a preinstalled table including the data representing the relationship shown in FIG. 6.

STEP ST8: Determining if "V is out of the Allowed Range"

In this step ST8, it is determined whether the applied voltage V obtained at step ST7 is within an allowed range (defined by the specification).

If the applied voltage V is within the allowed range (OK), then the process proceeds to step ST11.

If the applied voltage V is out of the allowed range (NG), then the process proceeds to steps ST9 and ST10.

STEP ST9: "Check Failure Bits in the Block"

If the applied voltage V is out of the allowed range, the CPU 4 checks the failure bits in the block. The failure bits refer to particular bits that are defined in advance in the CPU 4 and that cannot be erased.

STEP ST10: "Read Sector Number"

The CPU 4 reads the sector number of the sector including a failure bit, and then the process proceeds to step ST11.

The detection of a sector including a failure bit in steps ST9 and ST10 allows blocks which partially include failure bits to be used effectively. In conventional techniques, any block including such bits that cannot be erased is not used at all. In most cases, however, failure bits exist only in a very limited part of a block. Therefore, it is possible to write data in the other sectors which include no failure bits, thereby improving the efficiency of data storage. For this purpose, the CPU 4 determines which sector is available for writing data according to the sector number that has been read in step ST10.

Even in the case where the CPU 4 performs block-erasing using an applied voltage within the allowed range, it is possible to erase all data, excluding failure bits, using the reference number of erasing pulses without any problems in the block-erasing operation.

STEP ST11: "Start of Block-Erasing Operation"

The CPU 4 produces a control signal CONT based on the applied voltage determined in the steps described above, and outputs it to the voltage control circuit 6. The voltage control circuit 6 generates supply voltages VCC and VPP corresponding to the applied voltage $V=V_0+\alpha$ a and applies them to the flash memory 5. At the same time, the CPU 4 applies the reference number of erasing pulses $n_0$ to the flash memory 5. If it has been concluded in step ST8 that the applied voltage V is out of the allowed range, then the voltage control circuit 6 applies voltages corresponding to the maximum value within the allowed range.

After applying the erasing pulses, the CPU 4 checks whether all data in the block have been successfully erased. If some data at a certain address has failed to be erased, the CPU 4 applies erasing pulses again so as to try to erase them, or if the CPU 4 acknowledges the data as a failure bit, it avoids writing data at that address.

STEP ST12: "Write the Voltage Data and the Pulse-Number Data of the Present Erasing Operation into the Block"

The CPU 4 writes the applied voltage and the number of pulses used this time in the block-erasing operation into the parameter storage area 31 of the block. In the case where the block was not entirely erased during one erasing process in step ST11, the number of erasing pulses that was required to completely erase the block may be written in this step ST12.

Thus, as the number of erasing pulses and the applied voltage are written each time, the contents of the parameter storage area 31 are updated every time the erasing operation is performed. This allows this block to be more readily erased in the next erasing operation according to steps ST6–ST10.

In this way, the block-erasing operation is completed. After this, data is written in this block. However, that operation will not be described here because it is performed in the same manner as in conventional techniques.

As described above, in the semiconductor disk device according to the first embodiment, when an erasing operation is performed for a block that needed a number of pulses in the previous erasing operation greater than the reference number, the voltages VCC and VPP applied to the flash memory are raised within the allowed range defined by the specification so that the erasing operation can be performed with a number of erasing pulses substantially equal to the reference number. This technique allows a block to be erased in a shorter erasing time, and also minimizes the variation of erasing times from block to block.

Furthermore, according to the first embodiment, as the voltage control circuit 7 can vary the supply voltages (VCC, VPP) of each block of the flash memory 5 to be erased, it is therefore possible to set the supply voltages to values greater than those generally employed in conventional techniques, thereby increasing the total speed for erasing entire blocks.

In the above description, the parameter storage areas 31 are distributed through the flash memory 5 so that each block has one parameter storage area. However, the present invention is not limited only to such a construction. The parameter storage areas 31 may also be provided separately from the data storage blocks 32 and may be concentrated in one area of the flash memory 5. Alternatively, the parameter storage areas 31 may also be disposed in the CPU 4.

In a case where the parameter storage areas 31 are disposed in the CPU 4, step ST12 is no longer necessary since the data, such as the number of erasing pulses, is not deleted during an erasing process.

In the above description, the number of erasing pulses and the supply voltage are given as examples of information stored in the parameter storage area 31. However, the present invention is not limited to these types of information. The correction value $\alpha$ associated with the supply voltage that corresponds to the difference between the number of pulses required in the previous erasing operation and the reference number may also be stored therein. In this case, the supply voltage can be determined simply by adding the correction value $\alpha$ to the reference supply voltage $V_0$. As a result, the steps ST7–ST10 become simpler and thus processing speed is improved.

Embodiment 2

In the first embodiment described above, the parameter storage area stores the number of pulses required in the previous erasing operation for each block. Furthermore, when an erasing operation is performed for a block that needs a number of erasing pulses greater than the predetermined reference number, the CPU raises the voltages of power supplies VCC and VPP applied to the flash memory within the allowed range defined by the specification, so that the required number of erasing pulses decreases and the variation of the erasing time from block to block is minimized.

However, some blocks including failure bits cannot be erased according to the technique of the first embodiment. If the entirity of such a block is disabled, the storage capacity of the flash memory decreases. In view of the above, in a second embodiment of the present invention, if there is a block that cannot be erased according to the technique of the first embodiment, the CPU disables only the sectors including a failure bit of the block according to information about the failure bit stored in a flag area. Therefore, the other sectors of the block can be used.

The second embodiment will be described below in further detail.

Figure 7:
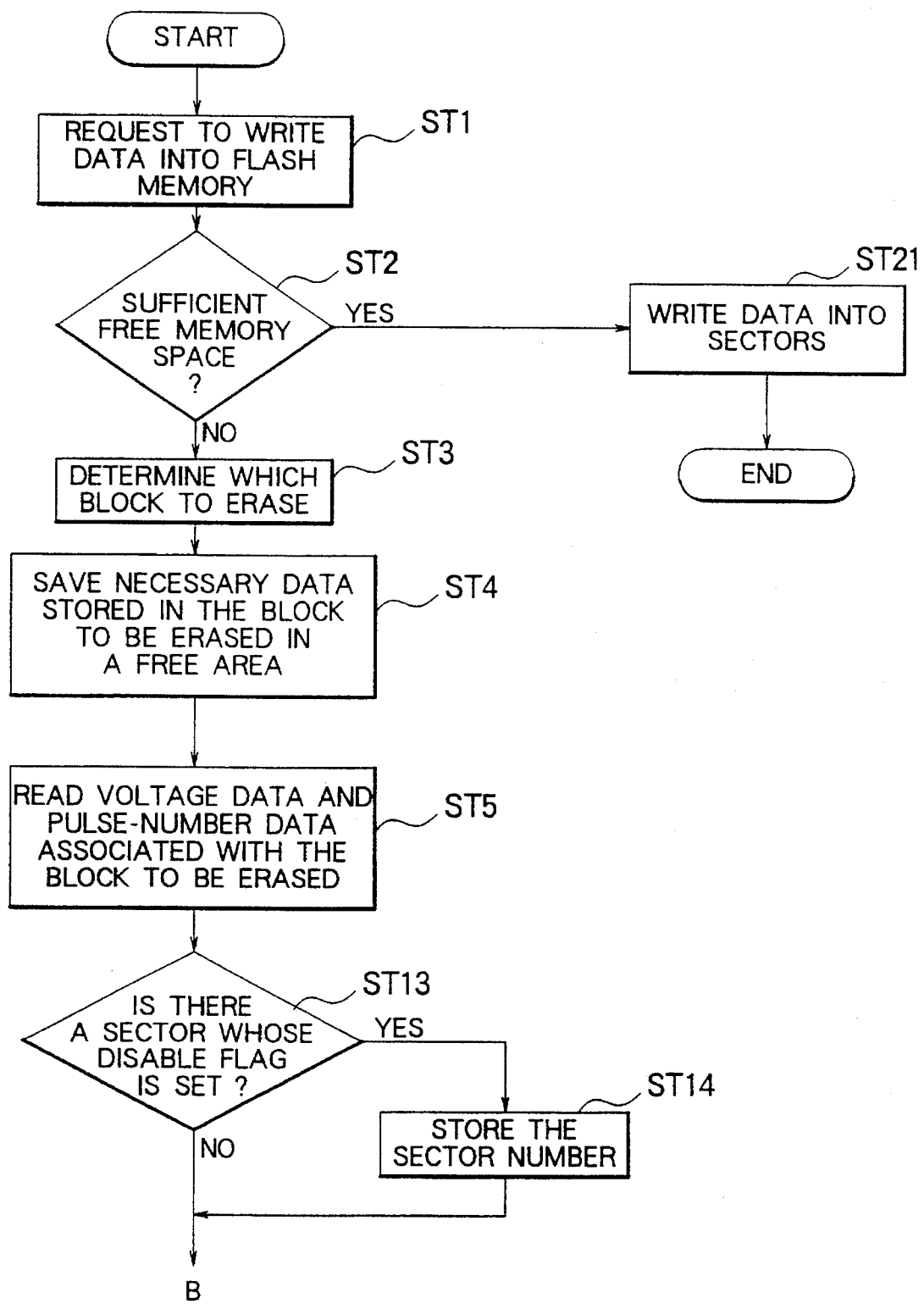
FIG. 7 is a flow chart illustrating a block-erasing process of the semiconductor disk device according to a second embodiment of the present invention.
Figure 8:
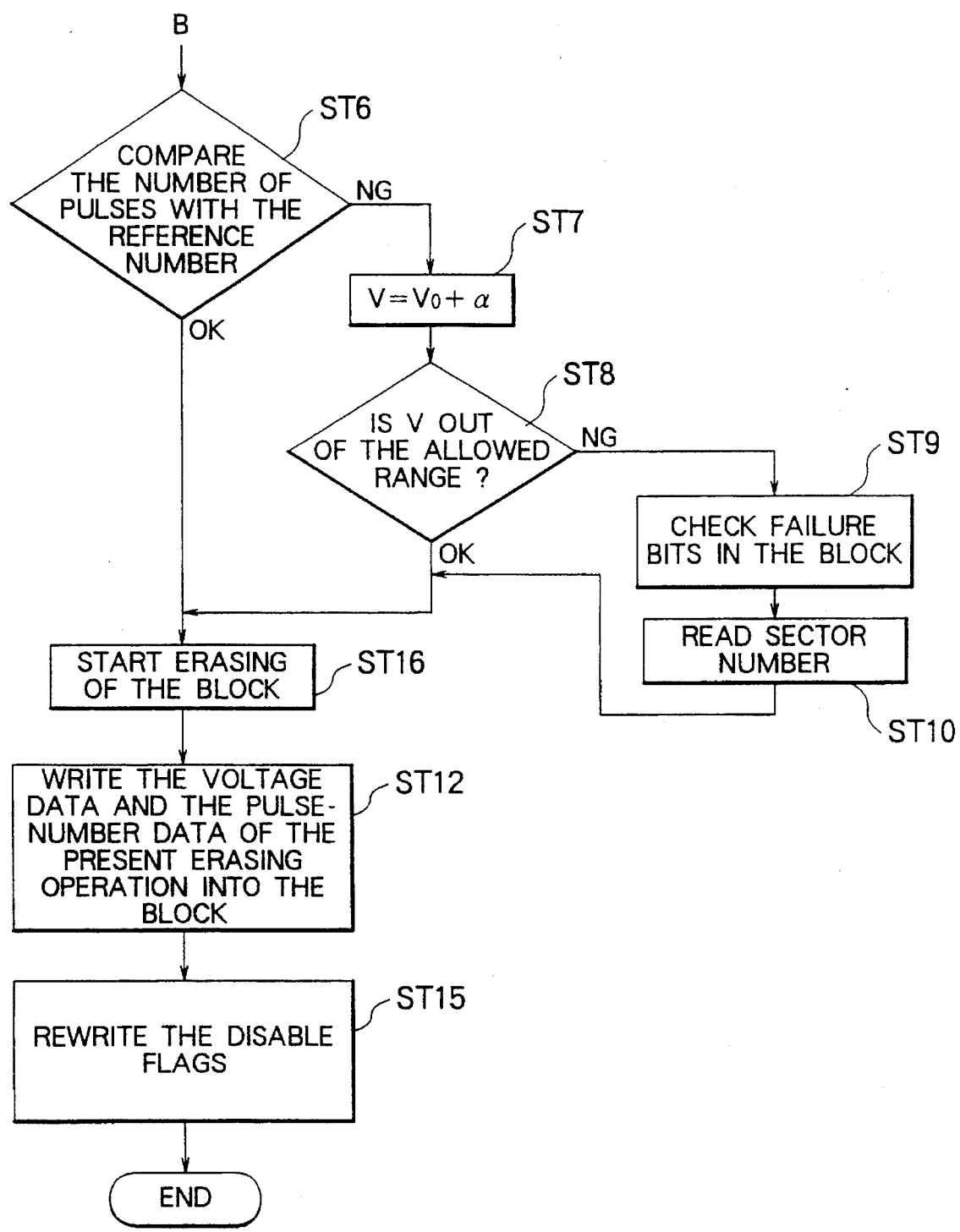
FIG. 8 is a flow chart continued from FIG. 7, illustrating the block-erasing process of the semiconductor disk device according to the second embodiment of the present invention.

FIGS. 7 and 8 are a flow chart illustrating a block-erasing process that is required when data is written in the flash memory 5. For convenience of representation, the complete flow chart is divided into two portions shown in FIGS. 7 and 8, respectively, wherein the output B of step ST13 or ST14 in FIG. 7 is the input B of step ST6 in FIG. 8. FIGS. 7 and 8 are similar to FIGS. 2 and 3 except that the flow chart given by FIGS. 7 and 8 includes steps ST13 and ST15.

Figure 9:
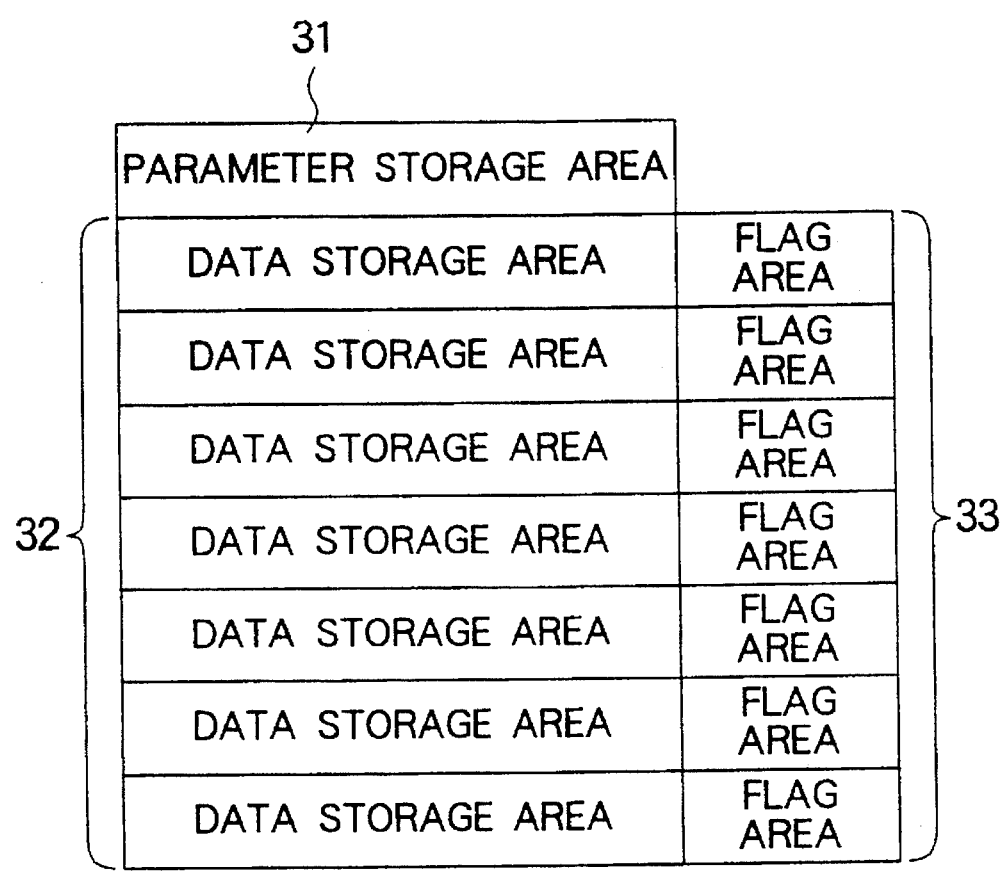
FIG. 9 is a schematic representation of an example of the memory space of one block of a flash memory used in the semiconductor disk device according to the second embodiment of the present invention.
Figure 10:
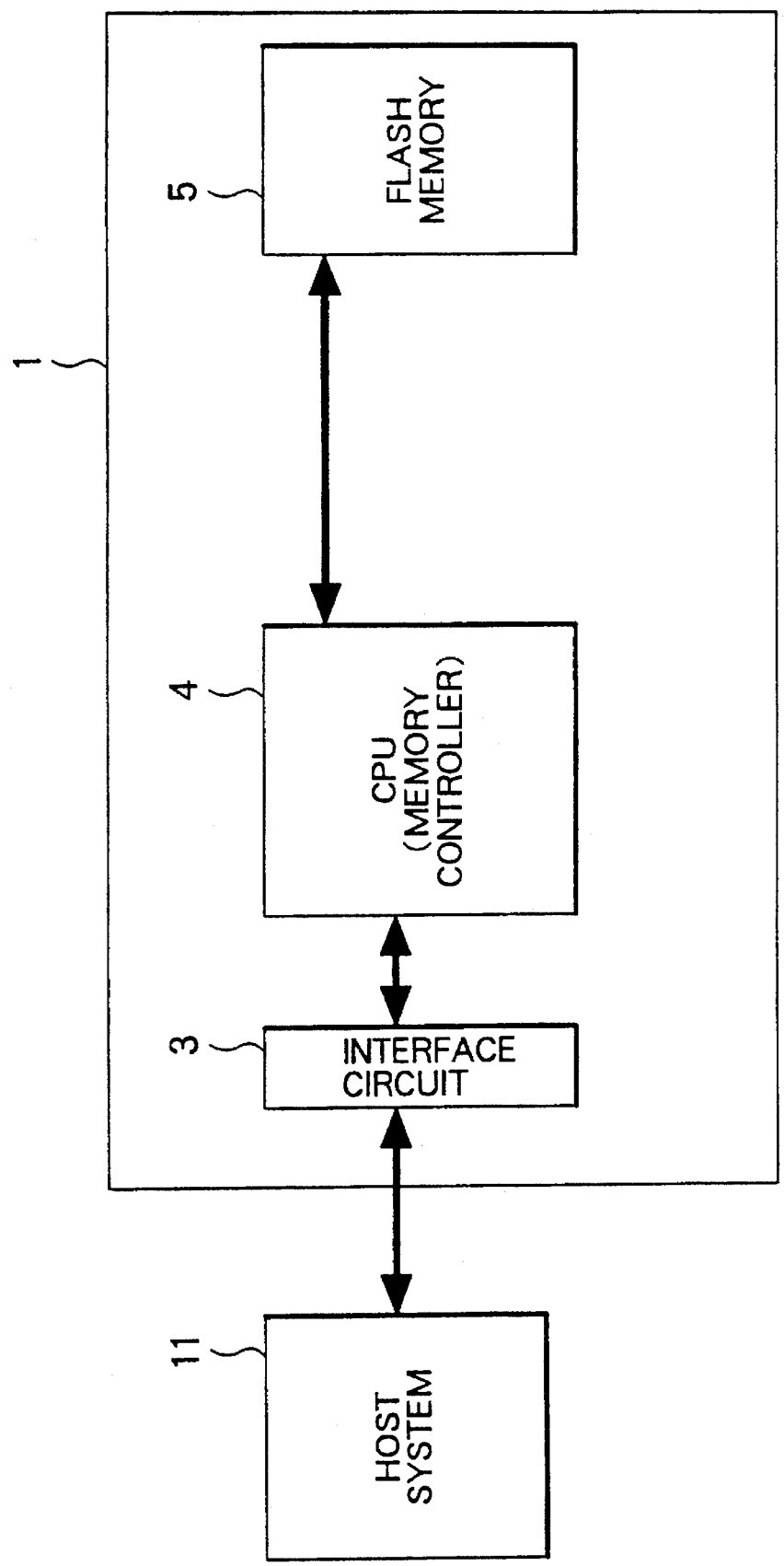
FIG. 10 is a schematic diagram illustrating a configuration of a conventional semiconductor disk device.

FIG. 9 illustrates the organization of one block of the flash memory 5 wherein the erasing of data is performed from block to block. As in the first embodiment, the erasing process of the flash memory 5 is performed from block to block wherein each block has a fixed size. The memory space of the flash memory 5 includes a plurality of blocks, and FIG. 9 illustrates the arrangement of one of these blocks.

In FIG. 9, a parameter storage area 31 stores the number of pulses required in the previous erasing process, and also stores the value of the supply voltage used in that erasing process. Data storage areas 32 store data received from the host system 11. Each of these data storage areas 32 corresponds to a sector, that is, a unit in writing and reading operation. Each block has one parameter storage area 31. The block also includes flag areas 33 wherein one flag area 33 is provided for one corresponding data storage area 32. These flag areas 33 are used to disable corresponding data storage areas 32 as required.

The general configuration of the semiconductor disk device is the same as that shown in FIG. 1.

The operation will now be described in more detail.

In the second embodiment, if there is a block that cannot be erased even by an allowable maximum supply voltage, the CPU 4 sets a failure-bit flag in a flag area 33 corresponding to a failed sector of the block. According to the failure bits that have been set, the CPU 4 writes data in data storage areas 32 other than those corresponding to the failure bits.

Referring to the flow chart shown in FIGS. 7 and 8, the operation of the semiconductor disk device according to the second embodiment will be described in more detail.

Since steps ST1 through ST5 are the same as those in embodiment 1 that has already been described, these steps are not described in the following description.

In step ST5 "Read Voltage Data and Pulse Number Data Associated with the Block to be Erased", the data associated with the number of pulses required in the previous erasing process as well as the data associated with voltages of power supply VCC and VPP is read, and then the process proceeds to step ST13.

STEP ST13: Decide "Is there a Sector whose Disable Flag is set ?"

The CPU 4 checks the flag areas 33 in the block to be erased to determine whether there is a sector to which a disable flag is set. If there is no such a sector (no), then the process proceeds to step ST6.

If some sectors are disabled (yes), then the process proceeds to step ST14.

STEP ST14: "Store the Sector Number"

The CPU 4 stores which sectors (data storage areas 32) are disabled.

The process next proceeds to step ST6.

STEP ST6: "Compare Number of Pulses with Reference Number"

The CPU 4 compares the above read-out data representing the number of pulses of the previous erasing operation with the predetermined reference number. If these numbers are equal to each other or the difference is within a predetermined small range, then the process proceeds to step ST11 in which the block is erased.

If the difference is out of the above range, then the process proceeds to step ST7.

STEP ST7: "$V=V_0+\alpha$"

The CPU 4 adds a certain value a to the predetermined reference voltage $V_0$, so as to reduce the required number of erasing pulse by increasing the voltages VCC and VPP. A particular correction value $\alpha$ is determined in the same manner as in the first embodiment.

STEP ST8: Determine if "V is out of the Allowed Range"

The CPU 4 determines whether the applied voltage V obtained in step ST7 is within an allowed range (defined by the specification).

If the applied voltage V is within the allowed range (OK), then the process proceeds to step ST11.

If the applied voltage V is out of the allowed range (NG), then the process proceeds to steps ST9 and ST10.

STEP ST9: "Check Failure Bits in the Block"

If the applied voltage V is out of the allowed range, the CPU 4 checks the failure bits in the block. The failure bits refer to particular bits that cannot be erased and the information about which is stored in advance in the CPU 4.

STEP ST10: "Read the Sector Number"

The CPU 4 reads the sector number of a sector including a failure bit, and then the process proceeds to step ST16.

The detection of the sector including a failure bit in steps ST9 and ST10 allows blocks which partially include failure bits to be used effectively.

STEP ST16 : "Start Erasing of the Block"

The CPU 4 produces a control signal CONT based on the applied voltage determined in the previous steps, and outputs it to the voltage control circuit 6. The voltage control circuit 6 generates supply voltages VCC and VPP corresponding to the applied voltage $V=V_0+\alpha$ and applies them to the flash memory 5. At the same time, the CPU 4 applies the reference number of erasing pulses $n_0$ to the flash memory 5. If it has been concluded in step ST8 that the applied voltage V is out of the allowed range, then the voltage control circuit 6 applies voltages corresponding to the maximum value within the allowed range.

After applying the erasing pulses, the CPU 4 checks whether all data in the block have been successfully erased. However, if it has been concluded in steps ST13 and ST14 that some disable flags indicate the presence of disabled sectors, the CPU 4 does not perform verification on these sectors because these sectors will not be used.

STEP ST12: "Write the Voltage Data and the Pulse Number Data of the Present Erasing Operation into the Block"

The CPU 4 writes the applied voltage and the number of pulses used in the block-erasing operation at this time into the parameter storage area 31 of the block.

STEP ST15: "Rewrite the Disable Flags"

The CPU 4 rewrites the disable data that has been stored in advance in the flag areas 33 into the flag areas 33 of the block. This is necessary because the flag areas 33 are also erased during the block-erasing operation, and thus it is required to rewrite the disable data in the flag areas 33.

In this way, the block-erasing operation is completed. After this, data is written in the block. In this writing process, the CPU 4 writes the data in sectors (data storage areas 32) other than those that have been disabled by writing disable data in the corresponding flag areas 33. Further details of the data writing operation will not be described here.

As described above, an arbitrary data storage area 32 can be disabled by writing disable data in the corresponding flag area 33. This technique allows a block to be erased in a shorter erasing time, and also minimizes the variations of the erasing times from block to block even in the case where there is a bit that cannot be erased by the allowable maximum supply voltage.

Furthermore, the CPU 4 can know in advance which sectors are disabled by reading disable flags, and therefore it is possible to skip processing sectors including a failure bit during the block-erasing operation of the flash memory. This results in a higher operation speed in the next block-erasing operation.

In the above description, the flag areas 33 are distributed through the flash memory 5 so that each block has it own flag areas. However, the present invention is not limited to such a construction. The flag areas 33 may also be provided separately from the data storage blocks 32 and may be concentrated in one area of the flash memory. Alternatively, the flag areas 33 may also be disposed at proper locations in the CPU 4.

In the case where the flag areas 33 are disposed in the CPU 4, step ST15 is no longer needed since the disable flag is not deleted during an erasing process.

What is claimed is:

1. A semiconductor device, comprising:

a memory including a plurality of blocks, each block including a data storage area and an erasing-condition storage area in which an erasing condition has been written in advance;

a data controller for writing data provided from the outside into said data storage area of said memory, and for reading data from said data storage area of said memory and outputting the read data to the outside;

a power supply voltage calculating unit that compares the erasing condition stored in the erasing-condition storage area of said memory with a predefined reference condition, thereby determining a power supply voltage that minimizes the difference between said reference condition and an actual erasing condition for each block of said memory;

a memory power supply unit that, in response to the output of said power supply voltage calculating unit, supplies electric power to said memory during an erasing process; and an erasing-control unit that erases data from block to block of said memory.

2. A semiconductor device according to claim 1, wherein said power supply voltage calculating unit comprises:

comparison means for comparing the erasing condition written in the erasing-condition storage area of said memory with the predefined reference condition;

voltage addition means for, if said erasing condition differs from said reference condition, adding a voltage correction value corresponding to the difference between said reference condition and said erasing condition to a predetermined reference voltage value; and voltage limiting means for, if the voltage value obtained by said voltage addition means is not within a predetermined allowed range, limiting said voltage value to within said predetermined allowed range.

3. A semiconductor device according to claim 1, further including an erasing-condition updating unit that writes, into the erasing-condition storage area of said memory, an actual erasing condition for each block of said memory under which the block was erased based on the power supply voltage determined by said power supply voltage calculating unit.

4. A semiconductor device according to claim 1, wherein the erasing condition written into said erasing-condition storage area includes the power supply voltage and the number of erasing pulses required in the previous erasing process.

5. A semiconductor disk device according to claim 1, wherein the erasing condition written into said erasing-condition storage area includes a voltage correction value corresponding to the number of erasing pulses required in an erasing process.

6. A semiconductor device comprising:

a memory including a plurality of blocks, each block including: a data storage area, an erasing-condition storage area in which an erasing condition has been written, and a failure bit information storage area in which information about the presence of a failure bit has been written in advance;

a data controller for writing data provided from the outside into said data storage area of said memory and for reading data from said data storage area of said memory and outputting the read data to the outside;

a power supply voltage calculating unit that compares the erasing condition stored in the erasing-condition storage area of said memory with a predefined reference condition, thereby determining a power supply voltage that minimizes the difference between said reference condition and an actual erasing condition for each block of said memory;

a memory power supply unit that, in response to the output of said power supply voltage calculating unit, supplies electric power to said memory during an erasing process;

an erasing-control unit that erases data from block to block of said memory; and an erasing-check unit that determines an area having a failure bit according to the information written in said failure bit information storage area of said memory, and checks for areas other than said area including failure bits to determine whether data has been successfully erased.

7. A semiconductor device according to claim 6, wherein said power supply voltage calculating unit comprises:

comparison means for comparing the erasing condition written in the erasing-condition storage area of said memory with the predefined reference condition;

voltage addition means for, if said erasing condition differs from said reference condition, adding a voltage correction value corresponding to the difference between said reference condition and said erasing condition to a predetermined reference voltage value; and voltage limiting means for, if the voltage value obtained by said voltage addition means is not within a predetermined allowed range, limiting said voltage value to within said predetermined allowed range.

8. A semiconductor device according to claim 6, further including:

an erasing-condition updating unit that writes, into the erasing-condition storage area of said memory, an actual erasing condition for each block of said memory under which the block was erased according to the power supply voltage determined by said power supply voltage calculating unit; and a failure bit information updating unit that writes the information about the presence of failure bits that was previously stored and the information about the presence of an actual failure bit detected by said erasing-check unit, into said failure bit information storage area of said memory.

9. A semiconductor device according to claim 6, wherein the erasing condition written into said erasing-condition storage area includes the power supply voltage and the number of erasing pulses required in the previous erasing process.

10. A semiconductor device according to claim 6, wherein the erasing condition written into said erasing-condition storage area includes a voltage correction value corresponding to the number of erasing pulses required in an erasing process.

* * * * *